(12) United States Patent
Stoemmer

(10) Patent No.: US 7,332,443 B2
(45) Date of Patent: Feb. 19, 2008

(54) METHOD FOR FABRICATING A SEMICONDUCTOR DEVICE

(75) Inventor: Ralph Stoemmer, Neubiberg (DE)

(73) Assignee: Infineon Technologies AG, Munich (DE)

( * ) Notice: Subject to any disclaimer, the term of this patent is extended or adjusted under 35 U.S.C. 154(b) by 140 days.

(21) Appl. No.: 11/084,728

(22) Filed: Mar. 18, 2005

(65) Prior Publication Data

US 2006/0211261 A1    Sep. 21, 2006

(51) Int. Cl.
*H01L 21/31* (2006.01)
*H01L 21/469* (2006.01)

(52) U.S. Cl. ............... 438/766; 438/778; 438/162; 438/689; 438/299; 257/E21.129

(58) Field of Classification Search ........... 438/766, 438/773, 778, 162; 257/E21.129
See application file for complete search history.

(56) References Cited

U.S. PATENT DOCUMENTS

| | | | | |
|---|---|---|---|---|
| 3,725,161 A | * | 4/1973 | Kuper | 438/478 |
| 5,245,208 A | * | 9/1993 | Eimori | 257/344 |
| 5,358,894 A | * | 10/1994 | Fazan et al. | 438/440 |
| 5,426,069 A | * | 6/1995 | Selvakumar et al. | 438/60 |
| 5,792,679 A | * | 8/1998 | Nakato | 438/162 |
| 5,821,158 A | * | 10/1998 | Shishiguchi | 438/528 |
| 6,133,077 A | * | 10/2000 | Randazzo | 438/199 |
| 6,455,871 B1 | * | 9/2002 | Shim et al. | 257/12 |
| 6,723,541 B2 | * | 4/2004 | Sugii et al. | 435/166 |
| 6,864,141 B1 | * | 3/2005 | Lo et al. | 438/287 |
| 2002/0011603 A1 | * | 1/2002 | Yagishita et al. | 257/190 |
| 2003/0013305 A1 | * | 1/2003 | Sugii et al. | 438/689 |
| 2005/0245092 A1 | * | 11/2005 | Orlowski et al. | 438/758 |
| 2006/0060856 A1 | * | 3/2006 | Anderson et al. | 257/66 |

* cited by examiner

*Primary Examiner*—B. William Baumeister
*Assistant Examiner*—Igwe U. Anya
(74) *Attorney, Agent, or Firm*—Slater & Matsil, L.L.P.

(57) ABSTRACT

The present invention relates to a method for fabricating a semiconductor device. In order to provide for a high carrier mobility in an active region of the device, germanium atoms are implanted into a surface of a semiconductor substrate such that a germanium-containing layer inside the semiconductor substrate is formed. Then, the surface of the semiconductor surface is oxidized down to and including the upper part of the germanium-containing layer, thereby pushing the implanted germanium atoms from the surface down into the semiconductor substrate and thereby enhancing the germanium concentration inside the remaining germanium-containing layer and forming a layer with enhanced germanium concentration inside the semiconductor substrate. The fabrication of the semiconductor device is concluded such that the active region of the device is placed at least partly within the layer with enhanced germanium concentration.

17 Claims, 2 Drawing Sheets

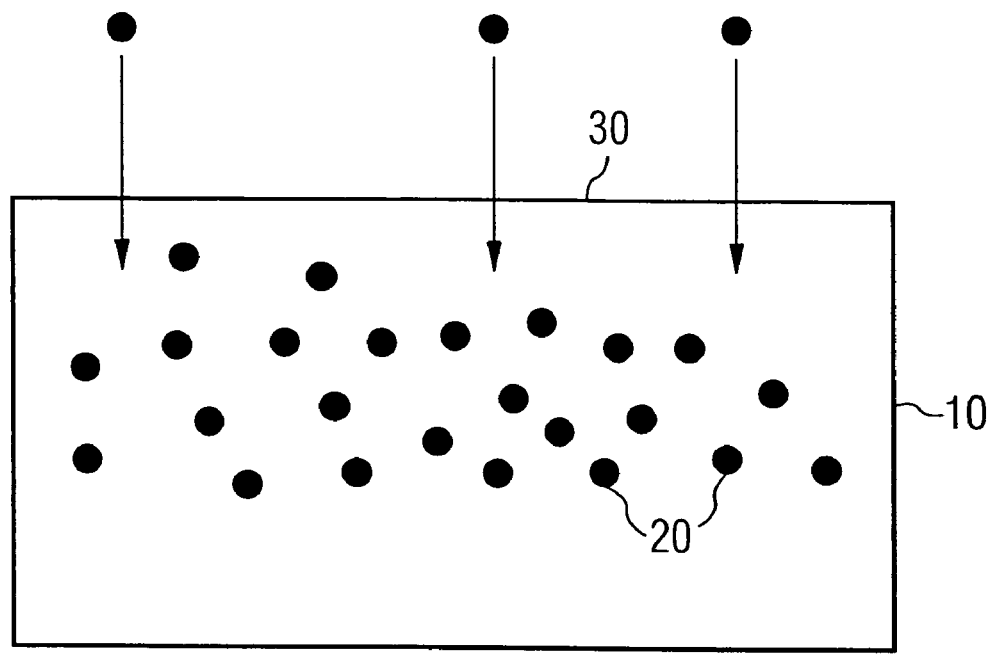
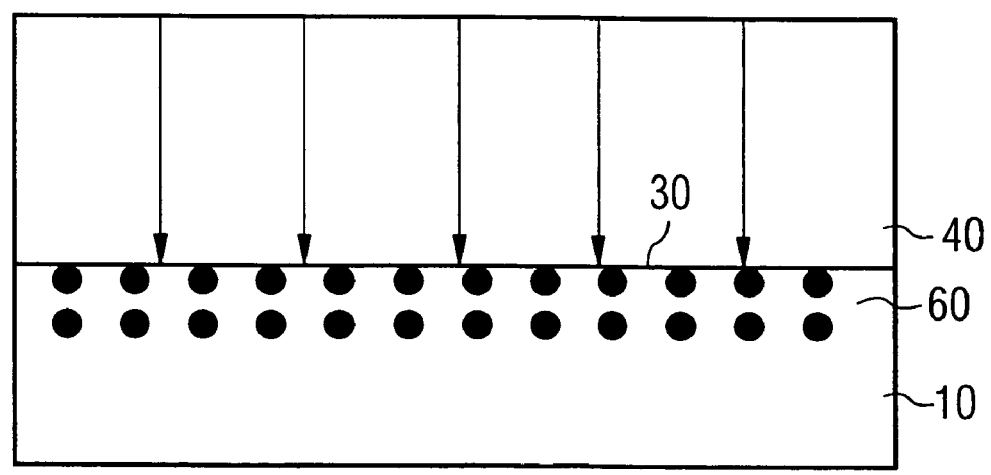

METHOD FOR FABRICATING A SEMICONDUCTOR DEVICE

TECHNICAL FIELD

The present invention relates to a method for fabricating a semiconductor device. More specifically, the present invention relates to a method for fabricating semiconductor devices that include active regions with enhanced germanium concentrations.

BACKGROUND

A method for fabricating a semiconductor device is described in U.S. Pat. No. 5,792,679, which application is incorporated herein by reference. This method includes implanting germanium atoms in a silicon substrate and forming a buried region of enhanced germanium concentration. The germanium atoms are implanted to a predetermined depth inside the silicon substrate such that a silicon layer remains on top of the germanium implanted region. Later on, the silicon layer is oxidized on top such that the germanium-containing region is kept unoxidized. The resulting structure is further processed in order to fabricate a field effect transistor. The channel of the field effect transistor includes the germanium-containing region and therefore exhibits a carrier mobility greater than the carrier mobility of pure silicon. This is due to the fact that germanium generally exhibits higher electron and hole mobilities than silicon.

SUMMARY OF THE INVENTION

In one aspect, the present invention provides a method for fabricating a semiconductor device with an active area that exhibits a high carrier mobility. In a further aspect, the present invention provides a method for fabricating semiconductor devices that reach high cut-off frequencies.

The method according to the preferred embodiment including implanting germanium into a surface of a semiconductor substrate, such as silicon as an example, and forming a germanium-containing layer inside the semiconductor substrate. Then, the surface of the semiconductor surface is oxidized down to and including the upper part of the germanium-containing layer. As germanium hardly oxidizes, the implanted germanium atoms are pushed down from the oxidizing semiconductor surface into the semiconductor substrate resulting in an enhanced germanium concentration inside the remaining germanium-containing layer. Thus, a layer with enhanced germanium concentration inside the semiconductor substrate is formed. The fabrication of the semiconductor device is concluded by placing an active region of the device at least partly within the layer with enhanced germanium concentration.

According to the invention, the implanted germanium-containing layer is partly oxidized. During this oxidation step, the implanted germanium atoms move away from the approaching oxide interface. As a result, the concentration of germanium in the remaining unoxidized germanium-containing layer is further increased and the electron and hole mobilities are further increased.

One advantage of embodiments of the present invention is that a semiconductor layer with a very large germanium concentration of 20% and more can be easily fabricated directly next to the substrate's surface.

An additional advantage of embodiments of the present invention is that on top of the germanium-containing layer, an oxide layer is grown during the fabrication. The formation of this oxide layer is one feature of the invention as it is normally very difficult to grow oxides on germanium or on semiconductor layers with high germanium concentrations. This oxide layer may serve as an insulation layer for field effect transistors or the like.

A third advantage of embodiments of the present invention is that during a single process step, three process results are obtained simultaneously. First, a layer with a very high germanium concentration is fabricated; second, an oxide layer is formed on top of the germanium-containing layer that would be otherwise hard to achieve; and third, crystal damages induced during the implantation of the germanium atoms are healed up.

According to a first preferred embodiment of the invention, the thickness of the oxide that was grown during the oxidation step, is reduced and the remaining oxide layer is directly used as an insulation layer on top of the active region. For example, the remaining oxide layer could be used as an insulation layer for devices like field effect components such as field effect transistors. In order to reduce the thickness of the oxide, an etch or polishing step may be applied.

Preferably, the semiconductor substrate is a silicon substrate as silicon is a standard material for the fabrication of integrated electrical or electronic devices.

As already mentioned, transistors such as field effect transistors may be fabricated inside the substrate. Preferably, a channel of the transistor is formed within the layer with enhanced germanium concentration as the carrier mobility is higher inside this layer than inside the surrounding silicon substrate and the cut-off-frequency of the transistor is increased.

Preferably, the oxidation step is carried out at a temperature between about 800 and 1200 degrees Celsius. The oxidation time depends on the oxidation temperature and further processing conditions (dry/wet oxidation, processing chemicals). For fixed processing conditions, oxidation temperature and oxidation time are the two main parameters determining the oxide thickness and the resulting germanium concentration.

In order to achieve a significant boost of carrier mobility, the oxidation step should be carried out such that the layer with enhanced germanium concentration contains at least 20% germanium.

A germanium implant dose of at least $10^{15}$ cm$^{-2}$, preferably of about $10^{16}$ cm$^{-2}$ and more germanium atoms, provides an adequate germanium concentration.

According to a second preferred embodiment of the invention, the oxide grown during the oxidizing step is removed completely. Then, the remaining semiconductor substrate is oxidized again during a second oxidation step wherein a second oxide layer is formed. During this second oxidation step the implanted germanium atoms are further pushed down into the substrate and the germanium concentration inside the layer with the enhanced germanium concentration is further enhanced. Preferably, the second oxide layer is used as an insulation layer for field effect transistors or the like.

BRIEF DESCRIPTION OF THE DRAWINGS

In order that the manner in which the above-recited and other advantages and objects of the invention are obtained will be readily understood, a more particular description of the invention briefly described above will be rendered by reference to a specific embodiment thereof, which is illustrated in the appended drawings. Understanding that these drawings depict only a typical embodiment of the invention and are not, therefore, to be considered limiting of its scope, the invention will be described and explained with additional specificity and detail through the use of the accompanying drawings in which FIGS. 1-5 illustrate an exemplary embodiment of the inventive method.

DETAILED DESCRIPTION OF ILLUSTRATIVE EMBODIMENTS

Figure 3:
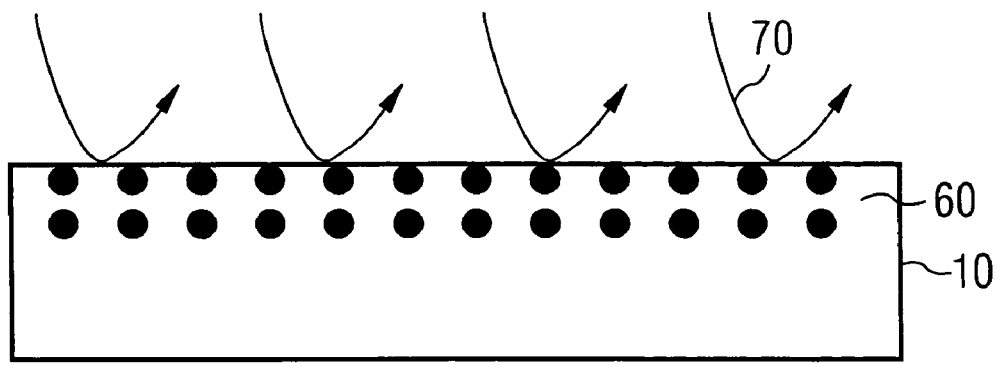

The preferred embodiment of the present invention will be best understood by reference to the drawings, wherein like parts are designated by like numerals throughout.

It will be readily understood that the process steps of the present invention, as generally described and illustrated in the figures herein, could vary in a wide range of different process steps. Thus, the following more detailed description of the exemplary embodiment of the present invention, as represented in FIGS. 1-5 is not intended to limit the scope of the invention, as claimed, but is merely representative of a presently preferred embodiment of the invention.

The present invention provides a method for fabricating a semiconductor device. As an exemplary embodiment of the invention, the fabrication of a field effect transistor is described hereinafter.

In a first process step, germanium is implanted into a silicon substrate 10, which can be predoped by B, As, P or other dopants known in the art. Alternatively, silicon substrate doping can be applied after the germanium is implanted. The germanium atoms are referred to by reference numeral 20. Preferably, an implant dose between $10^{15}$ cm$^{-2}$ and $10^{17}$ cm$^{-2}$ is applied. For the embodiment described hereinafter, an exemplary implant dose of approximately $10^{16}$ cm$^{-2}$ is chosen.

After completing the implantation, the surface 30 of the substrate 10 is oxidized such that an oxide layer 40 is grown on top. As germanium hardly oxidizes, the implanted germanium atoms 20 are pushed down into the substrate 10 such that the germanium atoms are concentrated in a layer directly below the surface 30 of the substrate 10. The resulting layer with enhanced germanium concentration is designated by reference numeral 60 in FIG. 2.

The oxidation is preferably carried out at a temperature of approximately 1000 degrees Celsius. The oxidation step may last for about 25-30 minutes. In this way, a germanium concentration of approximately 20% can be achieved, thus the resulting layer 60 is a $Si_{1-x}Ge_x$ layer with x approximately 0.8.

During the oxidation step, crystal damages induced during the preceding implantation of germanium are healed up.

FIG. 3 shows the substrate 10 after removal of the oxide layer 40. The oxide layer 40 can be removed by wet chemical etching. This is illustrated by arrows 70. In other embodiments, other etching methods can be used.

Figure 4:
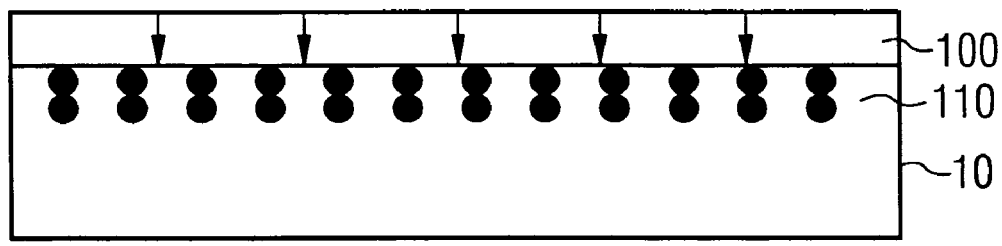

Then, a second oxidation step is carried out. During this second oxidation step, a thin oxide layer 100 is grown. This is illustrated in FIG. 4. The thickness of the oxide layer 100 is preferably just a few nanometers since this oxide layer 100 will be used later on as an insulation layer for a gate contact of the field effect transistor. This will be explained further below in detail.

During the second oxidation step, the germanium atoms near the surface 30 are further pushed down into the silicon substrate 10 such that the concentration of germanium atoms in the germanium-containing layer 60 is further increased. In this way, a layer 110 with a further enhanced germanium concentration is formed inside the silicon substrate 10. Depending upon the oxidation temperature and oxidation time, the germanium concentration increases to values of 40% and more. Even a concentration of 100% germanium can be obtained directly below the oxidized surface 30. The resulting structure after the second oxidation step is illustrated in FIG. 4.

Figure 5:
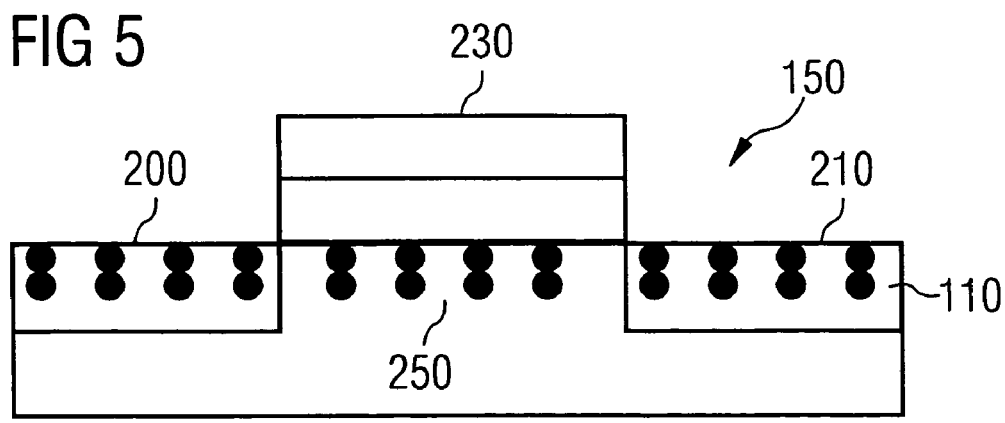

Afterwards, the fabrication of the field effect transistor 150 is completed by forming source and drain regions 200, 210 on top of the layer 110 with enhanced germanium concentration and by forming a gate contact 230 on top of the oxide layer 100. The gate contact 230 may consist of polysilicon or metal. The source and drain regions 200, 210 can be fabricated by implanting doping material into the layer 110 with enhanced germanium concentration according to manufacturing processes known in the art. The resulting field effect transistor 150 is shown in FIG. 5. It can be seen that a channel 250 of the transistor 150 is part of an active region of the transistor and that the channel 250 is formed within the layer 110 with a further enhanced germanium concentration.

What is claimed is:

1. A method for fabricating a transistor device having a source region, a drain region and a channel region the method comprising:

implanting germanium into a surface of a semiconductor body and forming a germanium-containing layer inside the semiconductor body having a first germanium concentration;

oxidizing the surface of the semiconductor surface down to and including an upper part of the germanium-containing layer, thereby pushing the implanted germanium atoms from the surface down into the semiconductor body and thereby enhancing the germanium concentration inside the remaining germanium-containing layer and forming a layer with an enhanced or a second germanium concentration inside the semiconductor body where said transistor is to be formed, and wherein the thickness of an oxide grown during said oxidation step is reduced and the remaining oxide layer with reduced thickness is used as a gate oxide for the transistor; and concluding the fabrication of the transistor device such that the source region, the drain region and the channel region of the transistor device is within the layer with enhanced germanium concentration such that each of the source region, the drain region and the channel region have said second germanium concentration.

2. The method according to claim 1, wherein the semiconductor body comprises a silicon substrate.

3. The method according to claim 1, wherein a field effect transistor is fabricated as the transistor device.

4. The method according to claim 1, wherein the oxidation step is carried out at a temperature between about 800 and 1200 degrees Celsius.

5. The method according to claim 1, wherein the oxidation step is carried out such that the layer with enhanced germanium concentration contains at least 20% germanium.

6. The method according to claim 1, wherein germanium is implanted by applying an implant dose of at least $10^{15}$ cm$^{-2}$.

7. The method according to claim 6, wherein germanium is implanted by applying an implant dose of at least $10^{16}$ cm$^{-2}$.

8. The method according to claim 1, wherein the thickness of the oxide is reduced by etching or polishing the oxide.

9. A method for fabricating a transistor device having a source region, a drain region and a channel region the method comprising:

implanting germanium into a surface of a semiconductor body and forming a germanium-containing layer inside the semiconductor body having a first germanium concentration;

oxidizing the surface of the semiconductor body down to and including an upper part of the germanium-containing layer, thereby pushing the implanted germanium atoms from the surface down into the semiconductor body and thereby enhancing the germanium concentration inside the remaining germanium-containing layer and forming a layer with an enhanced or second germanium concentration inside the semiconductor body;

completely removing an oxide grown during said oxidizing step;

re-oxidizing the surface of the remaining semiconductor substrate during a second oxidation step and forming a second oxide layer, thereby pushing implanted germanium atoms further down into the semiconductor body to further enhancing the germanium concentration inside another germanium containing layer, such that said another layer has a third germanium concentration; and concluding the fabrication of the transistor device such that the source region, the drain region and the channel region of the transistor device is within the another germanium containing layer, such that each of the source region, the drain region and the channel region have said third germanium concentration.

10. The method according to claim 9, wherein the second oxide layer is used as an insulation layer on top of the active region.

11. The method according to claim 10, wherein the semiconductor substrate is a silicon substrate.

12. The method according to claim 9, wherein a field effect transistor is fabricated as the semiconductor device.

13. The method according to claim 9, wherein the oxidation step is carried out at a temperature between about 800 and 1200 degrees Celsius.

14. The method according to claim 9, wherein the oxidation step is carried out such that the layer with enhanced germanium concentration contains at least 20% germanium.

15. The method according to claim 14, wherein germanium is implanted by applying an implant dose of at least $10^{-15}$ cm$^{-2}$.

16. The method according to claim 15, wherein germanium is implanted by applying an implant dose of at least $10^{-16}$ cm$^{-2}$.

17. The method according to claim 9, wherein the oxide produced during the first oxidation step is removed by etching or polishing.

* * * * *

UNITED STATES PATENT AND TRADEMARK OFFICE
CERTIFICATE OF CORRECTION

PATENT NO. : 7,332,443 B2
APPLICATION NO. : 11/084728
DATED : February 19, 2008
INVENTOR(S) : Stoemmer Page 1 of 1

It is certified that error appears in the above-identified patent and that said Letters Patent is hereby corrected as shown below:

In Col. 5, line 23, delete "enhancing" and insert --enhance--.
In Col. 6, line 20, delete "$10^{-15}$" and insert --$10^{15}$--.
In Col. 6, line 23, delete "$10^{-16}$" and insert --$10^{16}$--.

Signed and Sealed this

Tenth Day of June, 2008

JON W. DUDAS
*Director of the United States Patent and Trademark Office*